(12) United States Patent
Audebert et al.

(10) Patent No.: US 11,075,645 B2
(45) Date of Patent: Jul. 27, 2021

(54) CORRECTION OF A VALUE OF A PASSIVE COMPONENT

(71) Applicant: Commissariat à l'Énergie Atomique et aux Énergies Alternatives, Paris (FR)

(72) Inventors: Patrick Audebert, Varces-Allieres-et-Risset (FR); Gérard Billiot, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/878,323

(22) Filed: May 19, 2020

(65) Prior Publication Data

US 2020/0373937 A1 Nov. 26, 2020

(30) Foreign Application Priority Data

May 21, 2019 (FR) ...................... 1905330

(51) Int. Cl.
*H03M 1/66* (2006.01)
*H03M 1/46* (2006.01)
(Continued)

(52) U.S. Cl.
CPC .......... *H03M 1/466* (2013.01); *H03M 1/362* (2013.01); *H03M 1/808* (2013.01)

(58) Field of Classification Search
CPC ...... H03M 1/466; H03M 1/362; H03M 1/808; H03M 1/00
(Continued)

(56) References Cited

U.S. PATENT DOCUMENTS

| 4,091,340 A | * | 5/1978 | Greaves | ................... | H03B 5/20 |
| | | | | | 331/108 D |
| 4,091,341 A | * | 5/1978 | Greaves | ................... | H03B 5/20 |
| | | | | | 331/108 D |

(Continued)

FOREIGN PATENT DOCUMENTS

FR         1905330         2/2020

OTHER PUBLICATIONS

Preliminary Search Report for French Application No. 1905330, dated Feb. 6, 2020.
(Continued)

*Primary Examiner* — Jean B Jeanglaude (74) *Attorney, Agent, or Firm* — Wolf, Greenfield & Sacks, P.C.

(57) ABSTRACT

An integrated circuit including a first passive component of capacitive, resistive, or inductive type, including: a plurality of second and third passive components of said type, each having a same first theoretical value $Compu\_t$, the second components being connected together so that their values add, and each third component being associated with a first switch having its state determining whether the value of the third component adds to the values of the second components; and a plurality of fourth passive components of said type, each associated with a second switch having its state determining whether the value of the fourth component adds to the values of the second components, at least one of the fourth passive components having a second theoretical value equal to $(1-P).Compu\_t$ or to $(1+P).Compu\_t$, P being positive and smaller than $\frac{1}{2}$.

20 Claims, 5 Drawing Sheets

(51) Int. Cl.
*H03M 1/36* (2006.01)
*H03M 1/80* (2006.01)

(58) Field of Classification Search
USPC .......................................................... 341/150
See application file for complete search history.

(56) References Cited

U.S. PATENT DOCUMENTS

| | | | | |
|---|---|---|---|---|
| 9,197,194 | B2 * | 11/2015 | Reedy | ...................... H03H 7/38 |
| 10,419,058 | B2 * | 9/2019 | Tramoni | .................. H04B 1/40 |
| 2002/0034932 | A1 * | 3/2002 | Welland | ................. H03B 21/02 |
| | | | | 455/260 |
| 2004/0267134 | A1 * | 12/2004 | Hossack | ............... B06B 1/0292 |
| | | | | 600/459 |
| 2005/0116845 | A1 | 6/2005 | Lin | |
| 2013/0222075 | A1 * | 8/2013 | Reedy | ................ H01L 23/5223 |
| | | | | 333/32 |
| 2018/0034497 | A1 * | 2/2018 | Tramoni | ............. H04B 1/0458 |
| 2018/0262177 | A1 * | 9/2018 | Hahn | ...................... H01L 23/66 |

OTHER PUBLICATIONS

Goes et al., High-linearity calibration of low-resolution digital-to-analog converters. IEEE International Symposium on Circuits and Systems (ISCAS). May 30, 1994;5:345-8.

Leme et al., Efficient calibration of binary-weighted networks using a mixed analogue-digital RAM. IEEE International Symposium on Circuits and Systems (ISCAS). Jun. 11, 1991;1545-8.

* cited by examiner

CORRECTION OF A VALUE OF A PASSIVE COMPONENT

CROSS-REFERENCE TO RELATED APPLICATIONS

The present patent application This application claims priority to claims the priority benefit of French patent application FR19/05330, filed on May 21, 2019, the content of which is herein hereby incorporated by reference in its entirety to the maximum extent allowable by law.

TECHNICAL BACKGROUND

The present disclosure generally relates to integrated electronic circuits, and more particularly to the passive components, for example, resistors, capacitors, and inductances, of such integrated circuits.

PRIOR ART

Integrated electronic circuits comprising at least one passive component formed from identical unit passive components are known. To limit the surface area occupied by such integrated electronic circuits and the power consumption of these circuits, it is generally desired to form the passive component from unit passive components having low values, and thus small dimensions. However, the smaller the dimensions of the unit passive components, the greater the manufacturing dispersions on the value of the component formed from the unit components and the more likely they are to result in a significant difference between the target or theoretical value of the component and the real or practical value of the manufactured component.

SUMMARY

There is a need to correct, in an integrated electronic circuit, the difference between the theoretical or target value and the practical value of a passive component formed from a plurality of unit passive components.

An embodiment overcomes all or part of the disadvantages of known integrated passive components, and in particular of the correction of the practical value of such known integrated passive components.

An embodiment provides an integrated circuit comprising a first passive component of capacitive, resistive, or inductive type, comprising: a plurality of second and third passive components of said type, each having a same first theoretical value Compu_t, the second components being connected together so that their values add, and each third component being associated with a first switch having its state determining whether the value of the third component adds to the values of the second components; and a plurality of fourth passive components of said type, each associated with a second switch having its state determining whether the value of the fourth component adds to the values of the second components, at least one of the fourth passive components having a second theoretical value equal to (1−P).Compu_t or to (1+P).Compu_t, P being positive and strictly smaller than ½.

According to an embodiment, the first component has a target value equal to M.Compu_t, M being an integer, preferably greater than or equal to 1/P.

According to an embodiment, P.Compu_t determines a maximum desired difference between a practical value and a target value of the first component or a practical value of a fifth passive component, the first and fifth components having the same target value and being of the same type.

According to an embodiment, the integrated circuit further comprises a measurement circuit configured to deliver a signal representative of a difference between the practical value of the first component and the target value of the first component or the practical value of the fifth component.

According to an embodiment, the integrated circuit further comprises a circuit for controlling the first and second switches, configured to select any of the possible combinations of states of the first and second switches.

According to an embodiment, in a phase of characterization of the first component, the control circuit is configured to successively select at least some of said possible combinations of states of the first and second switches, preferably all of said possible combinations of states of the first and second switches.

According to an embodiment, in a correction phase, the control circuit is configured to select, among the combinations selected during the characterization phase, a combination of states of the first and second switches corresponding to the practical value of the first component closest to the target value or to the practical value of the fifth component.

According to an embodiment, said components are of capacitive type, the second components being connected in parallel to one another, each third component being series-connected to the first switch having the third component associated therewith, each fourth component being series-connected with the second switch having the fourth component associated therewith, each series association of a third component and of a switch and each series association of a fourth component and of a switch being connected in parallel to the second components.

According to an embodiment, P is smaller than or equal to ⅓, preferably ¼.

According to an embodiment, P is equal to 1/R, R being an integer.

According to an embodiment, the integrated circuit comprises M−R second components and R third components.

According to an embodiment, the integrated circuit comprises R fourth components.

According to an embodiment, all the fourth components have the same second theoretical value.

Another embodiment provides a digital-to-analog converter comprising an integrated circuit such as described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the integrated circuits and the usual applications where passive components formed from a plurality of unit passive components are provided have not been detailed, the described embodiments being compatible with such usual circuits and applications.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following description, unless otherwise indicated, the reference of a passive component having suffix "_p" added thereto designates the practical value of the component, and the reference of the passive component having suffix "_t" added thereto designates the theoretical or target value of this component.

Further, when reference is made to the voltage of a node or of a point, it is here considered that it is the voltage between the node or point and the ground, that is to say, that it is the potential of this node or point referenced to ground.

Further, a signal which alternates between a first constant state, for example, a low state, noted '0', and a second constant state, for example, a high state, noted '1', is called "binary signal". The high and low states of different binary signals of a same electronic circuit may be different. In particular, the binary signals may correspond to voltages or to currents which may not be perfectly constant in the high or low state. Further, information represented by a plurality of bits, that is, by a plurality of binary signals, is called binary word.

Figure 1:
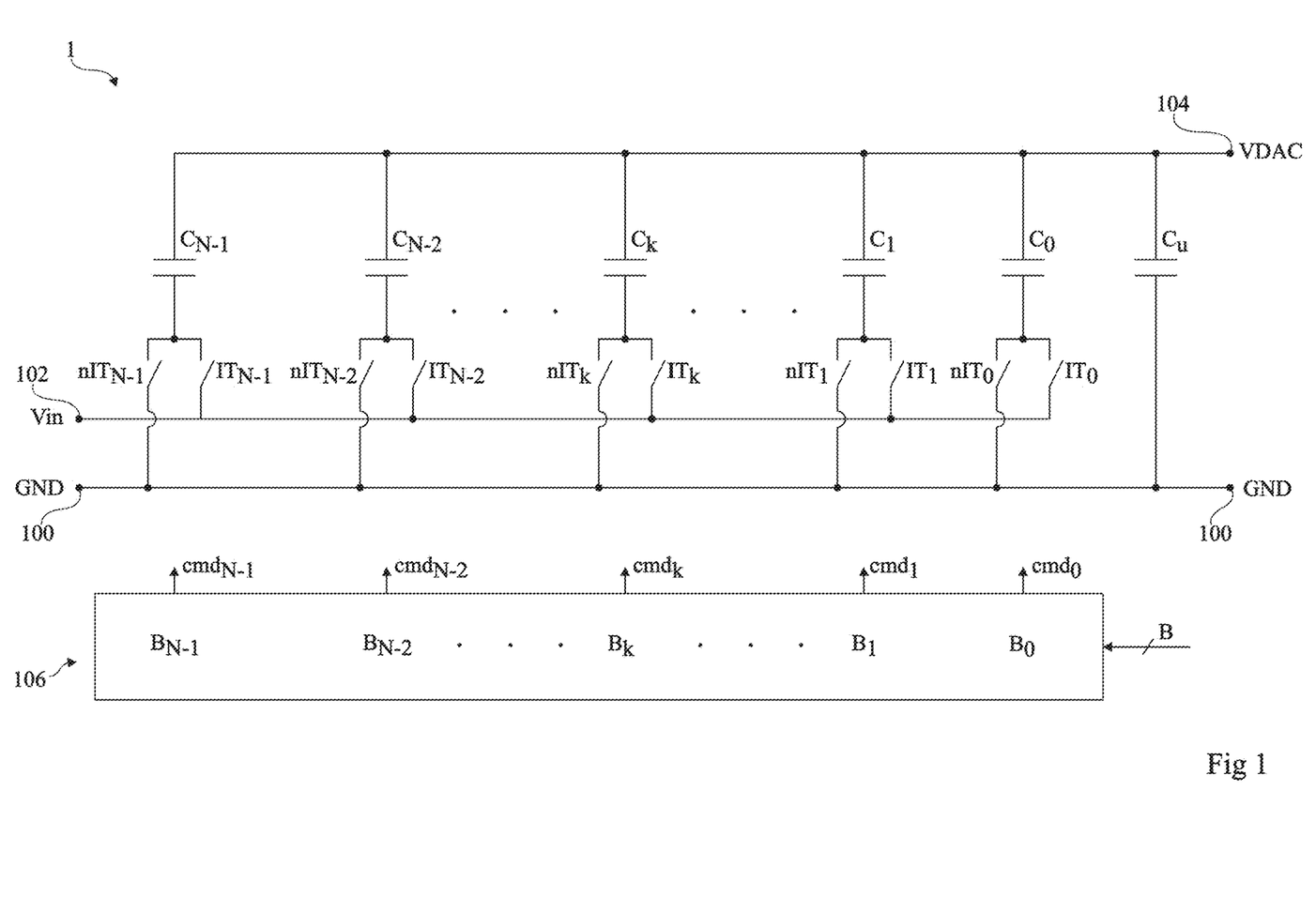
FIG. 1 schematically shows an example of a circuit comprising passive components, each formed from a plurality of unit passive components, of the type to which the described embodiments apply.

FIG. 1 schematically shows an example of a circuit 1 comprising passive components, each formed from a plurality of unit passive components, of the type to which the described embodiments apply. More particularly, FIG. 1 shows a capacitive digital-to-analog converter, or CDAC, 1 with a weighting over N bits, N being an integer greater than 2.

Converter 1 is configured to convert a binary word B of N bits $B_{N-1}$, $B_{N-2}$, ..., $B_k$, ..., $B_1$, $B_0$, where $B_{N-1}$ is the most significant bit and $B_0$ the least significant bit, into an analog potential VDAC. Potential VDAC is between a power supply potential Vin and a reference potential GND, typically the ground, potential VDAC being referenced to reference potential GND. Converter 1 comprises a conductive rail, or node, 100 intended to receive the reference potential, and a conductive rail, or node, 102 intended to receive power supply potential Vin. The output potential VDAC of converter 1 is available at the level of a conductive rail or node 104.

For each bit $B_k$ of word B, k being an integer in the range from 0 to N-1 and corresponding to the index of the bit, converter 1 comprises a capacitive component or capacitor $C_k$. Each capacitor $C_k$ has a theoretical value $C_{k\_t}$ equal to $2^k \cdot C_{u\_t}$ where $C_u$ is a unit capacitive component of theoretical value $C_{u\_t}$. Thus, although this is not shown in FIG. 1, each capacitor $C_k$ comprises $2^k$ capacitors $C_u$ connected in parallel between two terminals forming the two terminals, or electrodes, of capacitor $C_k$. Each capacitor $C_k$ has an electrode connected to rail 104, the other electrode of the capacitor being coupled to rail 102 by a switch $IT_k$ ($IT_{N-1}$, $IT_{N-2}$, ..., $IT_k$, ..., $IT_1$, $IT_0$) and to rail 100 by a switch $nIT_k$ ($nIT_{N-1}$, $nIT_{N-2}$, ..., $nIT_k$, ..., $nIT_1$, $nIT_0$). A unit capacitor $C_u$ is connected between rail 104 and rail 100.

Converter 1 further comprises a circuit 106 for controlling switches $nIT_k$ and $IT_k$. Circuit 106 receives binary word B and delivers the binary signals for controlling switches $IT_k$ and $nIT_k$. More particularly, in this example, circuit 106 delivers N binary control signals $cmd_k$ ($cmd_{N-1}$, $cmd_{N-2}$, ..., $cmd_k$, ..., $cmd_1$, $cmd_0$), each switch $IT_k$ receiving signal $cmd_k$ and each switch $nIT_k$ receiving the complement of signal $cmd_k$, for example, via an inverter, not shown in FIG. 1. In other words, when signal $cmd_k$ is such that switch $IT_k$ is on, the complement of signal $cmd_k$ is such that switch $nIT_k$ is off, and conversely.

In operation, for each bit $B_k$ at '1', circuit 106 delivers a signal $cmd_k$ such that switch $IT_k$ is on, and, for each bit $B_k$ at '0', circuit 106 delivers a signal $cmd_k$ such that switch $IT_k$ is off. Thus, the voltage VDAC theoretically available on rail 104 may be written according to the following formula Math. 1:

$$VDAC = Vin \cdot \frac{\sum_{k=0}^{N-1} B_k \cdot C_{k\_t}}{C_{u\_t} + \sum_{k=0}^{N-1} C_{k\_t}} \qquad \text{[Math 1]}$$

the value of voltage VDAC, in volt, thus being more particularly in the range from 0 to $Vin \cdot (2^N - 1)/2^N$.

The case where N is equal to 6 is considered as an example. Converter 1 is then configured to deliver, according to the value of word B, 64 voltage values VDAC with a pitch equal to Vin/64. However, in practice, each unit capacitor $C_u$ is subject to manufacturing dispersions. As a result, each capacitor $C_u$ may have a practical value $C_{u\_p}$, after manufacturing, different from its theoretical value $C_{u\_t}$. Thus, each capacitor $C_k$ may have a practical value $C_{k\_p}$, after manufacturing, different from its theoretical value $C_{k\_t}$. Thus, the difference between two voltages VDAC corresponding to two successive values of word B may then not be equal to the expected pitch Vin/64. In this example, this is more particularly true for the two voltages VDAC corresponding to the two words B="011111" and B="100000", that is, the two binary words of successive values which respectively implement the use of all capacitors $C_k$ except for the largest capacitor $C_{N-1}$ of CDAC 1, and the use of this largest capacitor only.

To overcome such differences between the practical value $C_{k\_p}$ and the theoretical value $C_{k\_t}$ of a capacitor $C_k$, it could be devised to form capacitor $C_k$ with a number X of unit capacitors $C_u$ in parallel greater than $2^k$, each associated with a switch to be able to select the combination of $2^k$ capacitors $C_u$ among X resulting in a practical value $C_{k\_p}$ of capacitor $C_k$ closest to theoretical value $C_{k\_t}$. Target value $C_{k\_t}$ may correspond to the practical value of another capacitor, typically the value of the assembly of capacitors $C_0$ to $C_{k-1}$ in parallel, when capacitor $C_k$ is desired to be paired with this assembly of capacitors in parallel $C_0$ to $C_{k-1}$. For these X capacitors $C_u$, X specific selection control signals should be provided, which results in complexifying the structure, in increasing the surface area of circuit 1, and in increasing the stray capacitances linked to the complex connections of the structure. Particularly, the stray capacitances limit the maximum reachable amplitude of voltage VDAC.

To overcome such differences between the practical value $C_{k\_p}$ and the theoretical value $C_{k\_t}$ of a capacitor $C_k$, it might also be devised to provide additional correction capacitors having theoretical values selected to be equal to $C_{u\_t}/2^1$, $C_{u\_t}/2^2$, $C_{u\_t}/2^3$ etc. . . . However, dispersions on the value of a passive component, here a capacitor, being all the greater as the value, and thus the surfaces area, of the component is small, the dispersions on the values of the correction capacitors may be greater than the dispersions which are desired to be corrected on the value of capacitor $C_k$. More particularly, unit capacitors $C_u$ being generally provided to have as low as possible a theoretical value $C_{u\_t}$ given their manufacturing method, the correction capacitors having a value smaller than or equal to $C_{u\_t}/2^m$, m being an integer greater than or equal to 1, may then be impossible to manufacture due to the technological constraints (pattern, etching, etc.) associated with such a manufacturing method. A solution would be to associate in series a plurality of unit capacitors $C_u$. However, such a connection of a plurality of unit capacitors $C_u$ would add stray capacitances altering the searched value $C_{u\_t}/2^m$. Further, such a solution would further increase the surface area of circuit 1. Moreover, for certain technologies, the implementation of such a series connection of unit capacitors $C_u$ may be difficult, or even impossible, as for example in the case where the unit capacitors $C_u$ of circuit 1 are capacitors with fingers formed in a comb structure where all capacitors $C_u$ have a common plate and are thus provided to be connected in parallel rather than in series.

Problems linked to the correction of the practical value $Ck_{k\_p}$ of a capacitor $C_k$ formed from $2^k$ unit capacitors of same theoretical value $C_{u\_t}$ have been disclosed herein. More generally, similar problems are posed to correct the practical value Comp_p of a passive component Comp of a given type, for example, resistive or inductive, when component Comp is formed from a plurality of unit passive components $Comp_u$ of the same type as component Comp and the theoretical value Comp_t of component Comp is equal to M times the theoretical value $Comp_{u\_t}$ of components $Comp_u$.

The inventors here provide correcting the practical value Comp_p of a passive component Comp formed from unit passive components $Comp_u$, by means of passive correction components $Comp_{corr}$ such as that at least one of correction components $Comp_{corr}$, preferably at least half of correction components correction $Comp_{corr}$, more preferably still all the correction components $Comp_{corr}$, have theoretical values $Comp_{corr\_t}$ close to but different from the theoretical value $Comp_{u\_t}$ of unit components $Comp_u$. It should be noted that each component $Comp_{corr}$ is then formed by a single component, and not as a series and/or parallel association of a plurality of unit components $Comp_u$.

It is here considered that a component $Comp_{corr}$ has a theoretical value $Comp_{corr\_t}$ close to the theoretical value $Comp_{u\_t}$ of a component $Comp_u$ when value $Comp_{corr\_t}$ is equal to $(1\pm P).Comp_{u\_t}$, P being positive and strictly smaller than ½. Preferably, P is greater than 1/20, or even than 1/10. Preferably, P is smaller than ⅓, or even than ¼. Value $P.Comp_{u\_t}$ then represents the desired accuracy on the corrected practical value Comp_p of component Comp. In other words, $P.Comp_{u\_t}$ corresponds to the maximum targeted difference between the theoretical or targeted value Comp_t and the corrected practical value Comp_p of component Comp.

Correction components $Comp_{corr}$ having a theoretical value $Comp_{corr\_t}$ strictly smaller than half of theoretical value $Comp_{u\_t}$, preferably greater than or equal to two thirds of theoretical value $Comp_{u\_t}$, more preferably greater than or equal to three quarters of theoretical value $Comp_{u\_t}$, enable to limit manufacturing dispersions on the practical value $Comp_{corr\_p}$ of component $Comp_{corr}$ as compared with the case where component $Comp_{corr}$ would have a theoretical value smaller than or equal to half of value $Comp_{u\_t}$.

Correction components $Comp_{corr}$ such as defined hereabove enable to reach an accuracy equal to $P.Comp_{u\_t}$ on the corrected practical value Comp_p of the component. Further, as compared with a selection of $2_k$ components $Comp_u$ among X components $Comp_u$ to correct the value Comp_p of a component Comp of theoretical value Comp_t equal to practical value $2_k.Comp_{u\_t}$, the correction of value Comp_p with components $Comp_{corr}$ such as defined hereabove requires less interconnections and less selection control signals, and thus results in a less complex structure. As an example, it is sufficient to provide at least 1/P selectable components $Comp_{corr}$ and to make at least 1/P components $Comp_u$ among the $2^k$ components $Comp_u$ selectable to allow a correction of value Comp_p with an accuracy of $P.Comp_{u\_t}$. The increase in the stray capacitances linked to this structure remains very limited and. in the case where this structure is used in the converter of FIG. 1, such an increase in the stray capacitances only slightly affects the maximum amplitude of voltage VDAC capable of being reached.

Figure 2:
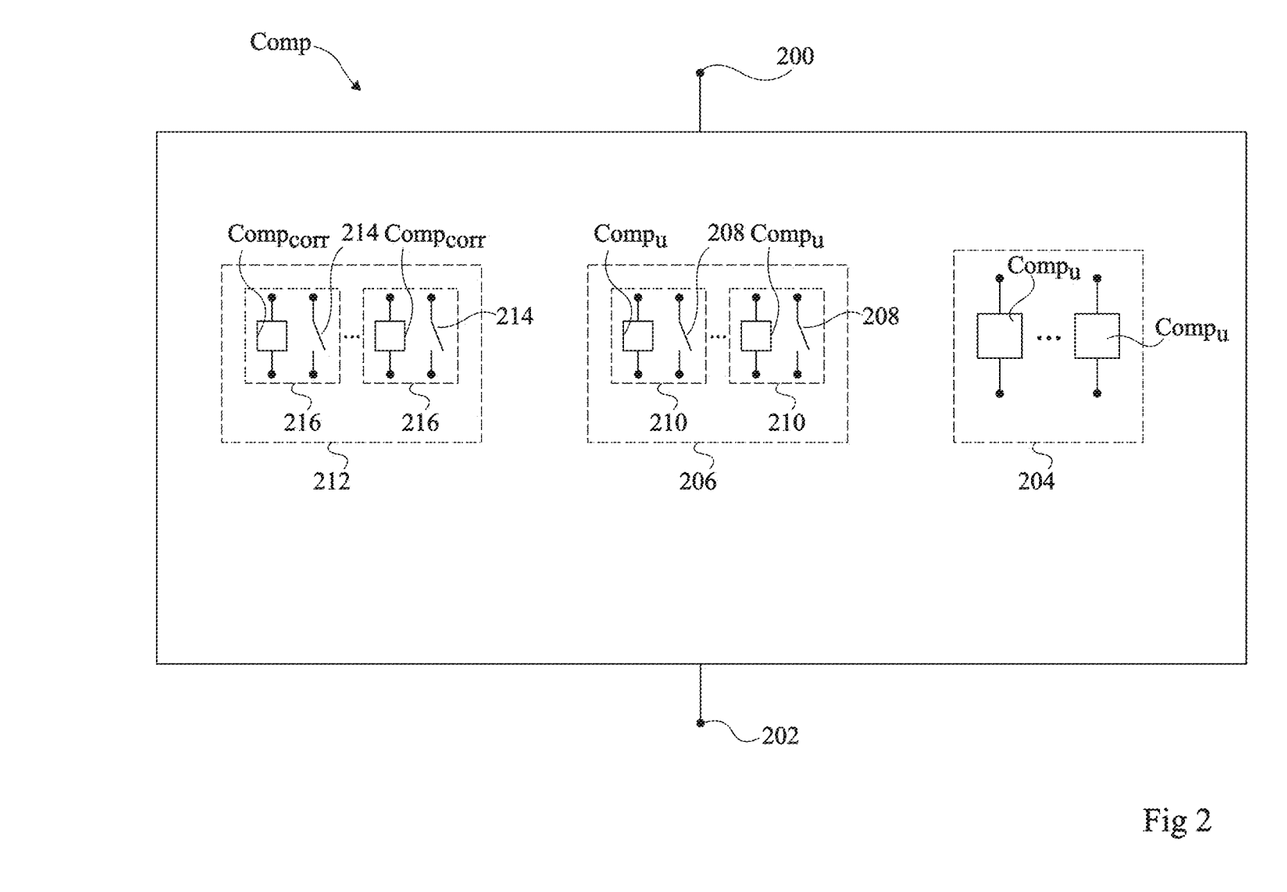
FIG. 2 schematically shows an embodiment of a passive component formed from a plurality of unit passive components.

FIG. 2 very schematically shows an embodiment of a resistive, inductive, or capacitive passive component Comp having its theoretical value Comp_t equal to M times the theoretical value $Comp_{u\_t}$ of a respectively resistive, inductive, or capacitive unit passive component $Comp_u$, M being a positive integer, preferably greater than or equal to 1/P, for example, equal to 128. Component Comp is then formed from at least M, preferably from M, identical unit components $Comp_u$. Further, in this example, it is desired to obtain a component Comp such that its practical value Comp_p can be corrected to be equal to its theoretical value Comp_t with a difference of at most ⅛ of $Comp_{u\_t}$. In other words, in this example, number P is equal to ⅛.

Component Comp comprises a first terminal 200 and a second terminal 202. The practical value Comp_p of passive component Comp, for example, the resistance, the inductance, or the capacitance according to cases, is taken or measured between terminals 200 and 202.

Component Comp comprises a plurality of unit components $Comp_u$, in this example, M components $Comp_u$, only some of which are shown in FIG. 2. Unit components $Comp_u$ are distributed in two assemblies 204 and 206. materialized by frames in dotted lines in FIG. 2.

In assembly 204, components $Comp_u$ are connected together so that, between terminals 200 and 202, their values add. In other words, between terminals 200 and 202, the assembly 204 of components $Comp_u$ has a theoretical value $M1.Comp_u\_t$, M1 being an integer smaller than M, M1 corresponding to the number of components $Comp_u$ of assembly 204. When P is equal to 1/R, R being an integer, M1 is preferably equal to M−R, that is, to M−8 in this example.

As an example, in the case of a resistive component Comp and of resistive components $Comp_u$, the M1 components $Comp_u$ of assembly 204 are series-connected, the series association of the components $Comp_u$ of first assembly 204 being coupled to terminals 200 and 202.

According to another example in the case of a capacitive component Comp and of capacitive components $Comp_u$, the M1 components $Comp_u$ of assembly 204 are connected in parallel, the parallel association of the components $Comp_u$ of first assembly 204 being connected to terminals 200 and 202.

In assembly 206, each component $Comp_u$ is associated with a switch 208. Each association 210 of a component $Comp_u$ and of a switch 208 is materialized by a frame in dotted lines in FIG. 2. Between terminals 200 and 202, associations 210 are connected together and, in each association 210, component $Comp_u$ and switch 208 are connected together, so that the off or on state of switch 208 determines whether the value of component $Comp_u$ adds or not to the sum of the values of the M1 components $Comp_u$ of assembly 204. In other words, between terminals 202 and 200, assembly 206 has a theoretical value equal to $j.Comp_u\_t$, j being an integer in the range from 0 to M2, M2 corresponding to the number of associations 210 of assembly 206 and j being determined by the state of switches 208. Further, the theoretical value of assembly 206 adds to the theoretical value of assembly 204. Preferably, M1+M2 is equal to M. M2 is for example at least equal to 1/P, preferably equal to 1/P. In this example, M2 is equal to 8.

As an example, in the case of a resistive component Comp and of resistive components $Comp_u$, in each association 210, switch 208 is connected in parallel with component $Comp_u$, and the M2 associations 210 are series-connected to one another. The series association of the M2 associations 210 is then series-connected to the series association of the M1 components $Comp_u$ of assembly 204. In other words, assemblies 204 and 206 are series-connected between terminals 200 and 202.

According to another example, in the case of a capacitive component Comp and of capacitive components $Comp_u$, in each association 210, switch 208 is series-connected to component $Comp_u$, and the M2 associations 210 are connected in parallel to one another. The parallel association of the M2 associations 210 is then connected in parallel to the parallel association of the M1 components $Comp_u$ of assembly 204. In other words, assemblies 204 and 206 are connected in parallel between terminals 200 and 202.

Component Comp further comprises an assembly 212 of a plurality of correction components $Comp_{corr}$. Each component $Comp_{corr}$ is associated with a switch 214. Each association 216 of a component $Comp_{corr}$ and of a switch 214 is materialized by a frame in dotted lines in FIG. 2. Between terminals 200 and 202, associations 216 are connected together and, in each association 216, component $Comp_{corr}$ and switch 214 are connected together, so that the off or on state of switch 214 determines whether the value of component $Comp_{corr}$ adds or not to the sum of the values of the M1 components $Comp_u$ of assembly 204. In other words, between terminals 202 and 200, assembly 212 has a theoretical value equal to $j'.Comp_u$, j' being an integer in the range from 0 to M3, M3 corresponding to the number of associations 216 and j' being determined by the state of switches 214. Further, the theoretical value of assembly 212 adds to the theoretical value of assemblies 204 and 206. M3 is for example at least equal to 1/P, preferably equal to 1/P when P is equal to 1/R, R being an integer. In this example, M3 is equal to 8.

As an example, in the ease of a resistive component Comp and of resistive components $Comp_{corr}$, in each association 216, switch 214 is connected in parallel to component $Comp_{corr}$, and the M3 associations 216 are series-connected to one another. The series association of the M3 associations 216 is then series-connected to the series association of the M1 components $Comp_u$ of assembly 204 and to the series association of the M2 associations 210 of assembly 206. In other words, assemblies 204, 206, and 212 are series-connected between terminals 200 and 202.

According to another example, in the case of a capacitive component Comp and of capacitive components $Comp_{corr}$, in each association 216, switch 214 is series-connected to component $Comp_{corr}$, and the M3 associations 216 are connected in parallel to one another. The parallel association of the M3 associations 216 is then connected in parallel to the parallel association of the M1 components $Comp_u$ of assembly 204 and to the parallel association of the M2 associations 210 of assembly 206. In other words, assemblies 204, 206, and 212 are connected in parallel between terminals 200 and 202.

Thus, between terminals 200 and 202, component Comp has a theoretical value Comp_t equal to $M1\text{-}19 Comp_u\_t + j.Comp_u\_t + j'.Comp_{corr}\_t$, j being determined by the combination of off or on states of the M2 switches 208 and j' being determined by the combination of off or on states of the M3 switches 214. In other words, component Comp may take several values, each value being determined by a combination of the states of switches 208 and 214. More particularly, the minimum theoretical value Comp_t is then equal to $M1.Comp_u\_t$, the maximum theoretical value Comp_t then being equal to $(M1+M2).Comp\_t + M3.Comp_{corr}\_t$. The difference between the maximum and minimum theoretical values corresponds to the maximum amplitude of the possible correction on the value of component Comp.

In this embodiment, all correction components $Comp_{corr}$ have a theoretical value $Comp_{corr}\_t$ equal to $(1-P).Comp_u\_t$, that is, to ⅞ of value $Comp_u\_t$ in this example.

In this embodiment where all correction components $Comp_{corr}$ have the same value $Comp_{corr}\_t$, M3 is preferably selected so that P.M3 is greater than or equal to 1, preferably equal to 1, M3 being equal to 8 in this example.

The case where it is desired to obtain a component Comp having its practical value Comp_p, after a possible correction, equal to a targeted value of $128.Comp_u\_t$ is considered as an example. In this example, it is further considered that M1 is equal to 120, M2 is equal to 8, and M3 is equal to 8. With no manufacturing dispersions, this targeted value of component Comp is obtained for a nominal configuration, or combination, of the states of switches 208 and 214. In this nominal configuration, switches 208 are all in a same state so that the practical value of assembly 206 is equal to $8.Comp_u\_p$, and switches 214 are all in a same state so that the value of assembly 212 is equal to $0.Comp_{corr}\_p$, and thus to $0.Comp_{corr}\_t$. Thus, between terminals 200 and 202, component Comp has, in nominal configuration, a practical value Comp_p equal to $128.Comp_u\_p$. In the absence of manufacturing dispersions, the practical value Comp_p of component Comp is thus equal to its targeted value Comp_t, that is to 128.Comp$_u$_t.

Now assume as an example that the components Comp$_u$ of assembly 204 suffer from manufacturing dispersions such that, in the nominal configuration, the practical value Comp_p of component Comp is equal to 128.25.Comp$_u$_t. It is further considered as an example, to illustrate a correction of the value Comp_p of component Comp, that, in assembly 206, values Comp$_u$_p and Comp$_u$_t are equal, and that, in assembly 212, values Comp$_{corr}$_p and Comp$_{corr}$_t are equal. To correct practical value Comp_p, two switches 208 are controlled so that the values of the associated components Comp$_u$ no longer add to the sum of the values of the components Comp$_u$ of assembly 204, or, in other words, are subtracted from practical value Comp_p in nominal configuration. Further, two switches 214 are controlled so that the values of the associated components Comp$_{corr}$ add to the sum of the values of the components Comp$_u$ of assembly 204, or, in other words, are added to the practical value Comp_p in nominal configuration. As a result, the practical value Comp_p of component Comp after correction is then equal to practical value Comp_p in nominal configuration minus 2.Comp$_u$_t plus 2.Comp$_{corr}$_t, and thus to 128.25.Comp$_u$_t–0.25.Comp$_u$_t, and thus to the targeted value Comp_t equal to 128.Comp$_u$_t.

The inventors have observed, when all the possible theoretical values Comp_t of component Comp between terminals 200 and 202 are ordered by increasing order of value, that there exists a range of values where a constant difference or pitch equal to P.Comp$_u$_t separates each two successive values of this range. Further, this range is substantially centered on the targeted value M.Comp$_u$_t of component Comp. In this range, the practical value Comp_p of component Comp can thus be corrected to be equal to M.Comp$_u$_t with an accuracy equal to P.Comp$_u$_t.

Due to the fact that the above-mentioned range is substantially centered on the targeted value of component Comp, the correction of the practical value of the above-described component Comp is adapted to Gaussian distributions of the manufacturing dispersions.

In another embodiment, all the correction components Comp$_{corr}$ have a same theoretical value Comp$_{corr}$_t equal to (1+P).Comp$_u$_t, that is, to 9/8 of theoretical value Comp$_u$_t in the present example.

An advantage of correction components Comp$_{corr}$ having a theoretical value Comp$_{corr}$_t equal to (1+P).Comp$_u$_t, as compared with correction components Comp$_{corr}$ having a theoretical value Comp$_{corr}$_t equal to (1–P).Comp$_u$_t, is that they are less subject to manufacturing dispersions, although they occupy a larger surface area.

An example of correction of the value Comp_p of component Comp has been described hereabove by considering zero manufacturing dispersions on the components Comp$_u$ of assembly 206 and on the components Comp$_{corr}$ of assembly 212. In practice, such components are also subject to manufacturing dispersions. Thus, the selection of the components Comp$_{corr}$ of assembly 212 and of the components Comp$_u$ of assembly 206 having their values adding, between terminals 200 and 202, to the value of assembly 204, is preferably performed by taking such dispersions into account. As a result, the practical value of component Comp can be corrected with the desired accuracy. More particularly, between terminals 200 and 202, it is possible to select all or part of the M2 components Comp$_u$ of assembly 206 and all or part of the M3 components Comp$_{corr}$ of assembly 212, which results in $2^{(M2+M3)}$ possible correction combinations by taking into account manufacturing dispersions on components Comp$_u$ and Comp$_{corr}$. In the previous example, this results in 65,536 possible correction configurations.

The above-described correction example is considered again, but now considering manufacturing dispersions on the components Comp$_u$ of assembly 206 and on the components Comp$_{corr}$ of assembly 212, possibly different between these various components. In this example, the two components Comp$_u$ to be de-selected in assembly 206 are selected among the eight components Comp$_u$ of assembly 206, and the two components Comp$_{corr}$ to be selected in assembly 212 are selected among the eight components Comp$_{corr}$ of assembly 212. There then exist (8.7).(8.7)=3,136 possible combinations of states of switches 208 and 214 resulting in the de-selection of components Comp$_u$ in assembly 206 and in the selection of two components Comp$_{corr}$ in assembly 212. Each of these 3,136 combinations may result in a different corrected practical value Comp_p. The choice of the components to be selected and of the components to be de-selected, or in other words the choice of the combination of states of switches 208 and 214, is then performed so that the corresponding corrected practical value Comp_p is as close as possible to the targeted value Comp_t of component Comp.

Figure 3:
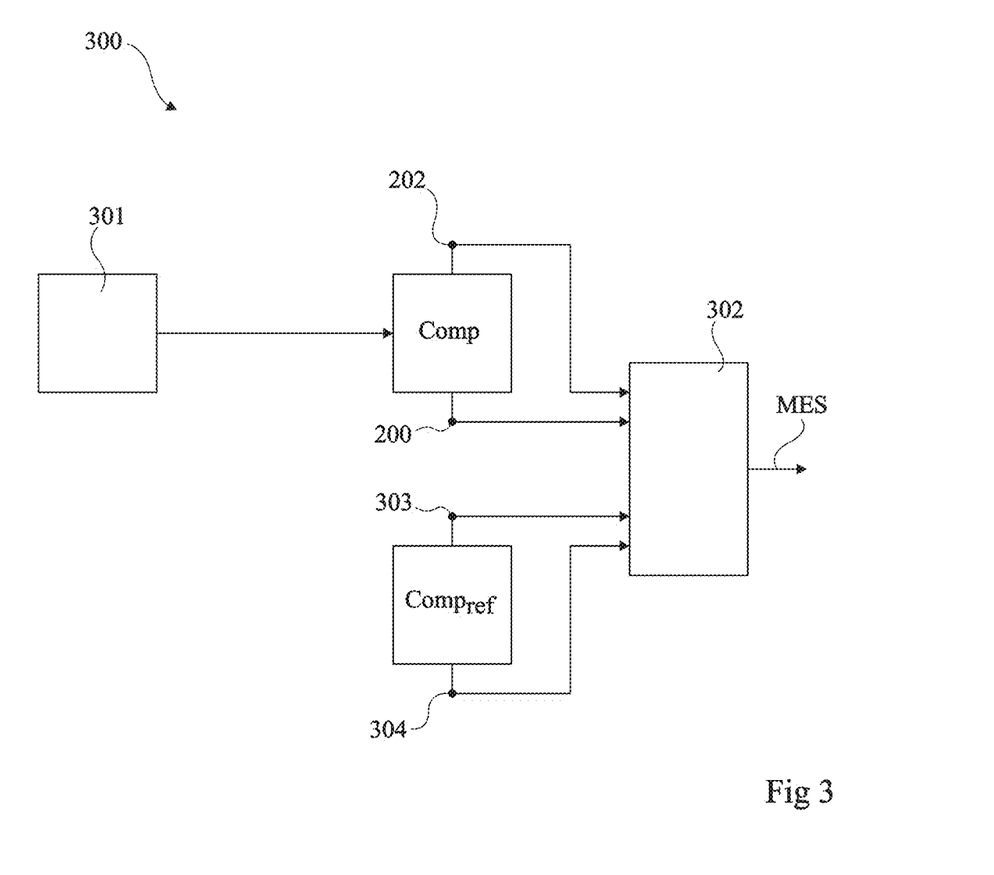
FIG. 3 schematically shows in the form of blocks an embodiment of an electronic circuit comprising a component of the type of that in FIG. 2.

FIG. 3 schematically shows in the form of blocks an embodiment of an electronic circuit 300 comprising the component Comp of FIG. 2.

In this embodiment, circuit 300 is configured to implement a step of correction of the practical value Comp_p of component Comp so that its corrected practical value Comp_p is equal, with a difference of at most P.Comp$_u$_t, to the practical value Comp$_{ref}$_p of a reference component Comp$_{ref}$ having a theoretical value Comp$_{ref}$_t equal to the theoretical value Comp_t of component Comp. In other words, it is here desired to pair component Comp with component Comp$_{ref}$.

Thus, in this embodiment, circuit 300 comprises not only component Comp but also component Comp$_{ref}$.

Circuit 300 further comprises a control circuit 301. Control circuit 301 is configured to deliver the signals for controlling the switches 208 and 214 (not shown in FIG. 3) of component Comp. More particularly, circuit 301 is configured to control switches 208 and 214 to select, or implement, any of the combinations of states of switches 208 and 214.

Circuit 300 further comprises a measurement circuit 302. Circuit 302 is configured to deliver a signal MES representative of the difference between the practical value Comp_p of component Comp and, in this embodiment, the practical value Comp$_{ref}$_p of component Comp$_{ref}$. More particularly, circuit 302 receives a signal representative of the value Comp_p and, in this embodiment, a signal representative of value Comp$_{ref}$_p. In this example, circuit 302 is connected to terminals 200 and 202 of component Comp to receive the voltage present across component Comp, for example, when a constant current is supplied to component Comp, this voltage being representative of value Comp_p. In this example, circuit 301 is further connected to terminals 303 and 304 of component Comp$_{ref}$ to receive the voltage present across component Comp$_{ref}$, for example, when the same constant current as that supplied to component Comp is supplied to component Comp$_{ref}$, this voltage being representative of value Comp$_{ref}$_p. Circuit 302 then delivers a signal MES representative of the difference between the voltage across component Comp and the voltage across component Comp$_{ref}$, that is, a signal MES representative of the difference between the practical values Comp_p and Comp$_{ref}$_p of these components.

In practice, in the case of capacitive components Comp$_{ref}$ and Comp, one of terminals 200 and 202 and one of terminals 303 and 304 may be connected to a terminal of application of a reference potential, for example, the ground or a common-mode voltage.

In operation, during a phase of measurement or characterization of component Comp, circuit 301 controls switches 208 and 214 to successively select a plurality of the possible combinations of states of switches 208 and 214, preferably all possible combinations. For each selected combination, circuit 302 then supplies a signal MES representative of the difference between the practical values Comp_p and Comp$_{ref}$_p of this combination. For each selected combination, the corresponding signal MES takes into account manufacturing dispersions in component Comp$_{ref}$, in the unit components Comp of component Comp, and in the correction components Comp$_{corr}$ of component Comp.

During a next phase of correction of the practical value Comp_p of component Comp, circuit 301 selects, based on the signals MES obtained for the selected combinations of states of switches 208 and 214, the combination resulting in the smallest difference between the practical values Comp_p and Comp$_{ref}$_p of the respective components Comp$_{ref}$ and Comp. In practice, for this combination, such a difference is at most P.Comp$_u$_t.

In this embodiment, the practical value Comp_p of component Comp is thus corrected with respect to the practical value Comp$_{ref}$_p of component Comp$_{ref}$, that is, by using value Comp$_{ref}$_p as a reference. This embodiment is particularly advantageous when components Comp and Comp$_{ref}$ are desired to have equal practical values with an accuracy equal to P.Comp$_u$_t.

As an example, component Comp corresponds to the capacitance $C_{N-1}$ of the CDAC of FIG. 1 and component Comp$_{ref}$ corresponds to the parallel connection of all the other capacitors of the CDAC, that is, capacitors $C_{N-2}, \ldots, C_k, \ldots, C_1, C_0$, and $C_u$ of the CDAC. Indeed, to ensure a proper operation of CDAC 1, capacitor $C_{N-1}$ should have the same practical value as that of the parallel association of all the other capacitors of the CDAC, with an accuracy depending of the resolution of the CDAC. Similarly, prior to the correction of the value of capacitor $C_{N-1}$ referring to the value of the parallel association of all the other capacitors of CDAC 1, it may be provided to correct the value of capacitor $C_{N-2}$ by using, as reference component Comp$_{ref}$, the parallel association of capacitors $C_k$, k being the range from N-3 to 0, and of capacitor $C_u$. Capacitor $C_{N-2}$ is then implemented in the form of a component Comp such as described in relation with FIG. 2. More generally, it may be provided to correct each capacitor $C_k$ of the CDAC, with k in the range from 1 to N-1, by using as a reference component Comp$_{ref}$ the parallel association of capacitor $C_u$ and of capacitors $C_0$ to $C_{k-1}$, each capacitor $C_k$ of the CDAC, k being the range from 1 to N-1, then being implemented in the form of a corresponding component Comp such as described in relation with FIG. 2.

In an alternative embodiment, not shown, rather than correcting the value Comp_p of component Comp with respect to the value Comp$_{ref}$_p of a reference component Comp$_{ref}$, it is provided to correct value Comp_p directly with respect to the target value of component Comp, in practice equal to its theoretical value Comp_t. In this variant, component Comp$_{ref}$ may be omitted from circuit 300.

According to a first implementation, circuit 302 is configured to determine the practical value Comp_p of component Comp based on the signal representative of this value that circuit 302 receives and then to deliver a signal MES representative of the difference between the target value and the practical value of component Comp. In particular, target value Comp_t may be recorded in a memory of circuit 300, for example, a memory of circuit 302.

According to a second implementation, circuit 302 receives a signal representative of the target value Comp_t of component Comp and compares this signal with the signal representative of the practical value Comp_p of component Comp. Circuit 302 is then configured to deliver a signal MES representative of the difference between the two signals, and thus of the difference between the practical value Comp_p and the target value Comp_t of component Comp.

In these two implementations, after a characterization phase similar to that previously described, circuit 301 selects, based on the obtained signals MES, the combination of states of switches 208 and 214 resulting in the smallest difference between the practical and target values Comp_p and Comp_t of component Comp. In practice, for this combination, such a difference is at most P.Comp$_u$_t.

Figure 4:
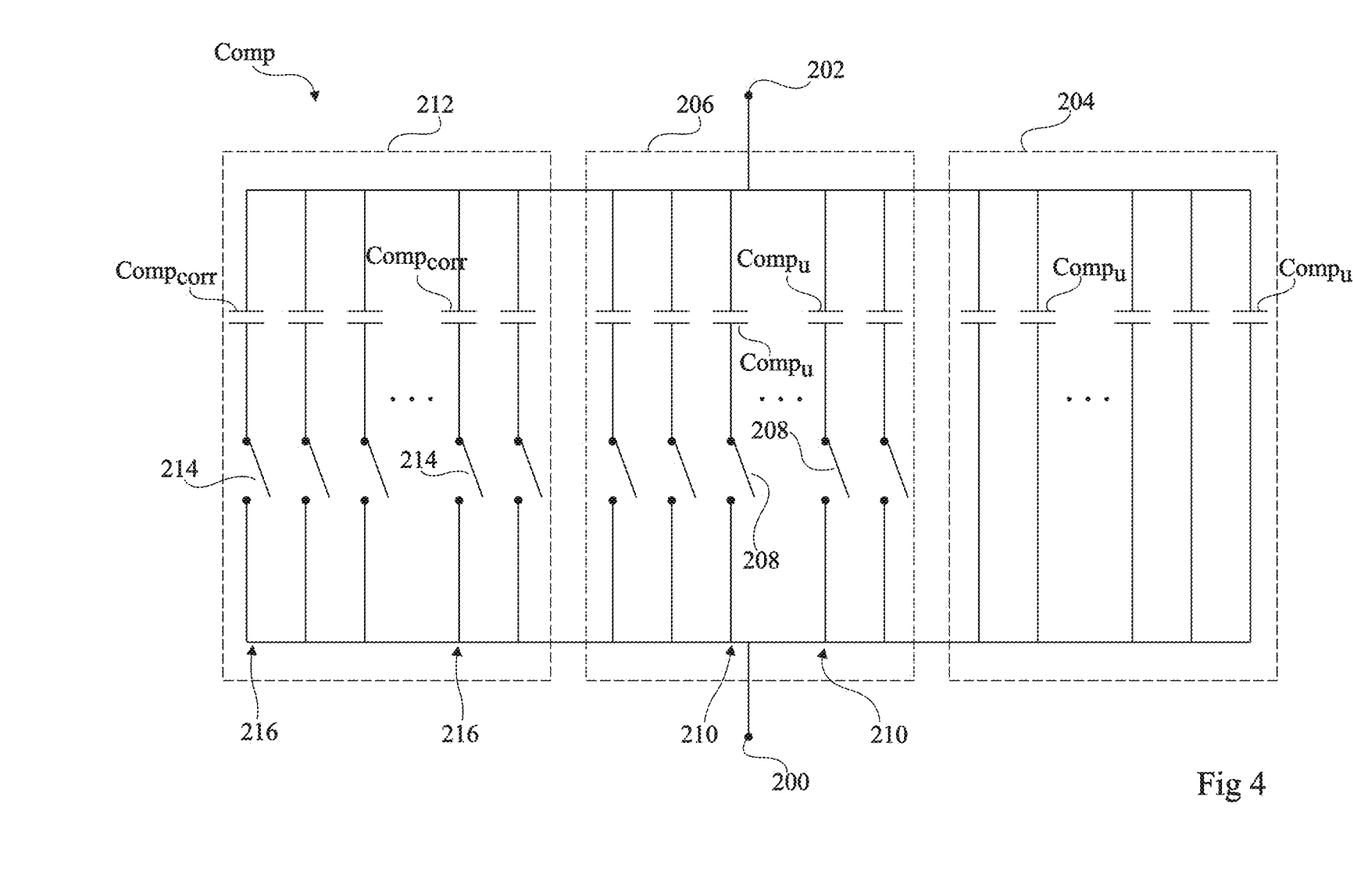
FIG. 4 shows in more detailed fashion an embodiment of a component of the type of that in FIG. 2, in the case where the component is of capacitive type.

FIG. 4 shows in more detailed fashion an embodiment of a component of the type of that in FIG. 2, in the case where the component is of capacitive type.

In this example, component Comp comprises assemblies 204, 206, and 212 connected in parallel between its terminals 200 and 202. Indeed, in this example, assemblies 204, 206, and 212 are capacitive, and their parallel connection between terminals 200 and 202 amounts to adding their values to one another. The capacitance value seen between terminals 200 and 202 is then equal to the sum of the values of the equivalent capacitors of assemblies 204, 206, and 212.

In assembly 204, the M1 unit capacitors Comp$_u$, for example, M1 unit capacitors $C_u$ described in relation with FIG. 1, are connected in parallel to one another so that their values add. Thus, between terminals 200 and 202, assembly 204 has a capacitance value equal to M1.Comp$_u$_p.

In assembly 206, in each association 210 of a switch 208 and of a unit capacitor Comp$_u$, for example, a unit capacitor $C_u$ described in relation with FIG. 1, switch 208 is series-connected to unit capacitor Comp$_u$. Further, the M2 associations 210 are connected in parallel to one another, between terminals 200 and 202. Thus, when the switch 208 of a given association 210 is off, the value of the unit capacitor Comp$_u$ of this association does not add to the value of assembly 204, and, conversely, when switch 208 is on, the value of unit capacitor Comp$_u$ adds to the value of assembly 204.

In assembly 212, in each association 216 of a correction capacitor Comp$_{corr}$ and of a switch 214, switch 214 is series-connected to correction capacitor Comp$_{corr}$. Further, the M3 associations 216 are connected in parallel to one another, between terminals 200 and 202. Thus, when the switch 214 of a given association 216 is off, the value of the correction capacitor Comp$_{corr}$ of this association does not add to the value of assembly 204, and, conversely, when switch 216 is on, the value of correction capacitor Comp$_{corr}$ adds to the value of assembly 204.

The structure of the component of FIG. 4 is compatible with an implementation by means of unit and correction capacitors $C_u$ and Comp$_{corr}$ with fingers, particularly when they have a common plate or electrode.

As an example, it is provided to implement at least the capacitor $C_{N-1}$ of the CDAC of FIG. 1 by means of the capacitive componenl of FIG. 4.

Figure 5:
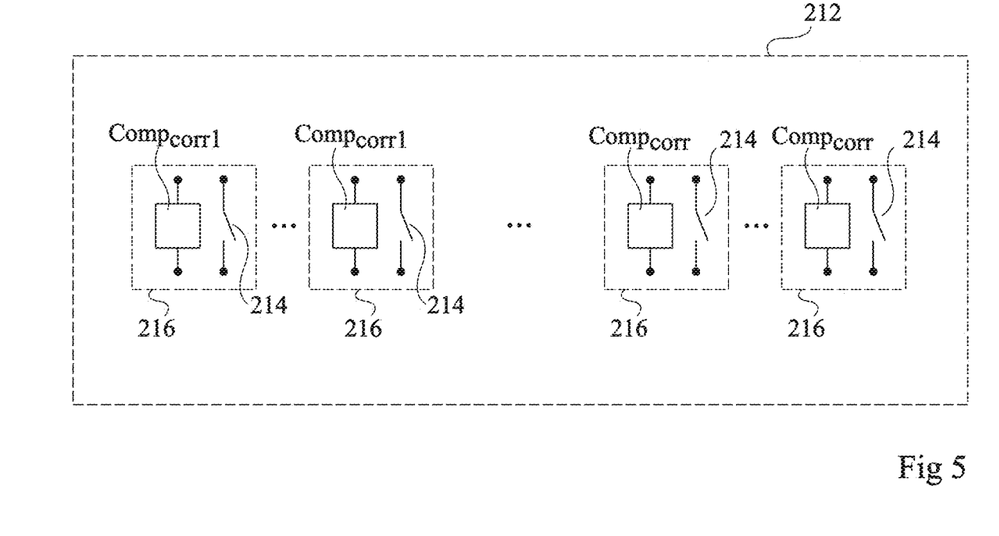
FIG. 5 schematically shows an alternative embodiment of a component of the type of that in FIG. 2.

FIG. 5 schematically shows an alternative embodiment of a component of the type of that in FIG. 2, only the assembly 212 of component Comp being shown in this drawing.

In this variant, conversely to the previously described embodiments and variants where the components $Comp_{corr}$ of assembly 212 all have the same theoretical value $Comp_{corr}$ equal to $(1+P).Comp_{u\_}t$ or to $(1-P).Comp_{u\_}t$, it is provided for assembly 212 to further comprise additional correction components, here bearing reference $Comp_{corr1}$, having a theoretical value $Comp_{corr1\_}t$ different from that of components $Comp_{corr}$. Components $Comp_{corr1}$ are, like components $Comp_{corr}$, each associated with a switch 214 having its state determining whether the value of component $Comp_{corr1}$ adds or not to the sum of the values of the components $Comp_u$ of assembly 204 (not shown) and to the sum of the values of the selected components $Comp_u$ of assembly 206 (not shown). In other words, assembly 212 comprises M3 associations 216, some of which are each formed with a component $Comp_{corr}$, the others being each formed with a component $Comp_{corr1}$ instead of component $Comp_{corr}$.

More particularly, according to a first variant, components $Comp_{corr}$ have a theoretical value equal to $(1+P).Comp_{u\_}t$, and components $Comp_{corr1}$ have a theoretical value equal to $(1-P).Comp_{u\_}t$.

According to a second variant, components $Comp_{corr}$ have a theoretical value equal to $(1+P).Comp_{u\_}t$, and components $Comp_{corr1}$ have a theoretical value equal to $(1+P_1).Comp_{u\_}t$, $P_1$ being different from P. In this second variant, what has been indicated in relation with P applies to $P_1$. In other words. $P_1$ is positive and strictly smaller than ½. Preferably, $P_1$ is greater than 1/20, or even than 1/10. Preferably, $P_1$ is smaller than 1/3, or even than 1/4.

The second variant enables, in the case where the desired accuracy on the value Comp_p of component Comp is equal to $P.Comp_{u\_}t$ and P is smaller than P1, to decrease the total number of correction components $Comp_{corr}$ and $Comp_{corr1}$ enabling to obtain a value Comp_p corrected with the desired accuracy with respect to the case where only components $Comp_{corr}$ are used. For example, when $P_1$ is equal to A.P, A being greater than 1, instead of providing at least 1/P components $Comp_{corr}$, at least A components $Comp_{corr}$ and at least $1/P_1$ components $Comp_{corr1}$, or even less than 1/P1 components $Comp_{corr1}$, may be provided. For example, with P equal to 1/10 and $P_1$ equal to 3/10, and thus to 3.P, 3 components $Comp_{corr}$ and 3 components $Comp_{corr1}$ are sufficient to correct value Comp_p with an accuracy of $P.Comp_{u\_}t$.

What is indicated hereabove remains trie when P is greater than $P_1$, P is equal to $A.P_1$, and the desired accuracy is $P_1.Comp_{u\_}t$, at least A components $Comp_{corr1}$ and at least 1/P components $Comp_{corr}$, or even less than 1/P components $Comp_{corr}$, then being provided.

According to a third alternative embodiment, components $Comp_{corr}$ have a theoretical value equal to $(1-P).Comp_{u\_}t$, and components $Comp_{corr1}$ have a theoretical value equal to $(1-P_1).Comp_{u\_}t$, $P_1$ being different from P. In this third variant, what has been indicated in relation with P applies to P1. As for the second alternative embodiment, when P is smaller than $P_1$, the third alternative embodiment enables to decrease the number of correction components sufficient to correct value Comp_p with an accuracy of $P.Comp_{u\_}t$, as compared with the case where only components $Comp_{corr}$ are used. What is indicated hereabove remains true when P is greater than $P_1$ and the desired accuracy is $P_1.Comp_{u\_}t$.

In the second and third variants described in relation with FIG. 5 the targeted accuracy on the corrected practical value Comp_p of component Comp is at least partly determined by the value of the smallest one of numbers P and $P_1$.

Further, in the alternative embodiments described in relation with FIG. 5, it will be within the abilities of those skilled in the art to determine, among the M3 associations 216. those which are formed with a correction component $Comp_{corr}$, and those which arc formed with a correction component $Comp_{corr1}$.

Various embodiments and variants have been described. Those skilled in the art will understand that certain features of these various embodiments and variant may be combined, and other variants will occur to those skilled in the art. In particular, a component Comp where certain associations 216 of assembly 212 comprise correction components $Comp_{corr}$ having a theoretical value $Comp_{corr\_}t$ equal to $(1+P).Comp_{u\_}t$, and where the other associations 216 of the assembly are formed with correction components $Comp_{corr1}$ having a theoretical value $Comp_{corr1\_}t$ equal to $(1-P_1).Comp_{u\_}t$, with $P_1$ different from P, may be provided.

Finally, the practical implementation of the embodiments and variants described herein is within the capabilities of those skilled in the art based on the functional indications provided hereinabove. In particular, it will be within the abilities of those skilled in the art to select values M1, M2, and M3 and/or the theoretical value(s) of the correction components of the associations 216 of assembly 212 according to the targeted application. Similarly, the implementation of circuit 300, and in particular of circuits 301 and 302, is within the abilities of those skilled in the art.

The invention claimed is:

1. An integrated circuit comprising a first passive component of capacitive, resistive, or inductive type, comprising:
   a plurality of second and third passive components of said type, each having a same first theoretical value $Comp_{u\_}t$, the second components being connected together so that their values add, and each third component being associated with a first switch having its state determining whether the value of the third component adds to the values of the second components; and
   a plurality of fourth passive components of said type, each associated with a second switch having its state determining whether the value of the fourth component adds to the values of the second components, at least one of the fourth passive components having a second theoretical value equal to $(1-P) .Comp_{u\_}t$ or to $(1+P) .Comp_{u\_}t$ , P being positive and strictly smaller than ½.

2. The circuit according to claim 1, wherein the first component has a target value equal to $M.Compu_t$, M being an integer, preferably greater than or equal to 1/P.

3. The circuit according to claim 2, wherein $P.Compu_t$ determines a maximum desired difference between a practical value and a target value of the first component or a practical value of a fifth passive component the first and fifth components having the same target value and being of the same type.

4. The circuit according to claim 3, further comprising a measurement circuit configured to deliver a signal representative of a difference between the practical value of the first component and the target value of the first component or the practical value of the fifth component.

5. The circuit according to claim 1, further comprising a circuit for controlling the first and second switches, configured to select any of the possible combinations of states of the first and second switches.

6. The circuit according to claim 5, wherein, in a phase of characterization of the first component, the control circuit is configured to successively select at least some of said possible combinations of states of the first and second switches, preferably all of said possible combinations of states of the first and second switches.

7. The circuit according to claim 4, wherein, in a correction phase, the control circuit is configured to select among the combinations selected during the characterization phase, based on the signal delivered by the measurement circuit for each combination selected during the characterization phase, a combination of states of the first and of second switches corresponding to the practical value of the first component closest to the target value or to the practical value of the fifth component.

8. The circuit according to claim 1, wherein said components are of capacitive type, the second components being connected in parallel to one another, each third component being series-connected to the first switch having the third component associated therewith, each fourth component being series-connected to the second switch having the fourth component associated therewith, each series association of a third component and of a switch and each series association of a fourth component and of a switch being connected in parallel to the second components.

9. The circuit according to claim 1, wherein P is smaller than or equal to ⅓, preferably ¼.

10. The circuit according to claim 1, wherein P is equal to 1/R, R being an integer.

11. The circuit according to claim 10, comprising M–R second components and R third components.

12. The circuit according to claim 11, comprising R fourth components.

13. The circuit according to claim 1, wherein all the fourth components have the same second theoretical value.

14. A digital-to-analog converter comprising the integrated circuit according to claim 1.

15. An integrated circuit comprising a first passive component of capacitive, resistive, or inductive type, comprising:
a plurality of second and third passive components of said type, each having a same first theoretical value $Comp_{u\_t}$, the second components being connected together so that their values add, and each third component being associated with a first switch having its state determining whether the value of the third component adds to the values of the second components; and
a plurality of fourth passive components of said type, each associated with a second switch having its state determining whether the value of the fourth component adds to the values of the second components, some of the fourth passive components having a same second theoretical value equal to $(1-P).Compu\_t$ or to $(1+P).Compu\_t$, P being positive and strictly smaller than ½, all other fourth passive components having a same third theoretical value equal to $(1-P1).Compu\_t$ or to $(1+P1).Compu\_t$, P1 being positive and strictly smaller than ½, P1 being or not equal to P.

16. The circuit according to claim 15, wherein P is equal to 1/R, R being an integer.

17. The circuit according to claim 16, comprising M–R second components and R third components.

18. The circuit according to claim 17, comprising R fourth components.

19. The circuit according to claim 15, wherein all the fourth components have the same second theoretical value.

20. An integrated circuit comprising a first passive component of capacitive, resistive, or inductive type, comprising:
a plurality of second and third passive components of said type, each having a same first theoretical value $Comp_{u\_t}$, the second components being connected together so that their values add, and each third component being associated with a first switch having its state determining whether the value of the third component adds to the values of the second components;
a plurality of fourth passive components of said type, each associated with a second switch having its state determining whether the value of the fourth component adds to the values of the second components, at least one of the fourth passive components having a second theoretical value equal to $(1-P) .Comp_{u\_t}$ or to $(1+P) . Comp_{u\_t}$, P being positive and strictly smaller than ½;
wherein the first component has a target value equal to $M.Compu\_t$, M being an integer, preferably greater than or equal to 1/P;
wherein $P.Compu\_t$ determines a maximum desired difference between a practical value and a target value of the first component or a practical value of a fifth passive component the first and fifth components having the same target value and being of the same type; and
further comprising a measurement circuit configured to deliver a signal representative of a difference between the practical value of the first component and the target value of the first component or the practical value of the fifth component;
wherein, in a correction phase, the control circuit is configured to select among the combinations selected during the characterization phase, based on the signal delivered by the measurement circuit for each combination selected during the characterization phase, a combination of states of the first and of second switches corresponding to the practical value of the first component closest to the target value or to the practical value of the fifth component.

* * * * *